AUTOMATIC VOLUME CONTROL SYSTEM

Filed Dec. 10, 1956

Charles T. Jacobs

By George H. Fritzinger
Agt.

United States Patent Office 2,956,237

Patented Oct. 11, 1960

2,956,237

AUTOMATIC VOLUME CONTROL SYSTEM

Charles T. Jacobs, Bernardsville, N.J., assignor, by mesne assignments, to McGraw-Edison Company, Elgin, Ill., a corporation of Delaware Filed Dec. 10, 1956, Ser. No. 627,325

1 Claim. (Cl. 330—124)

Figure 1:
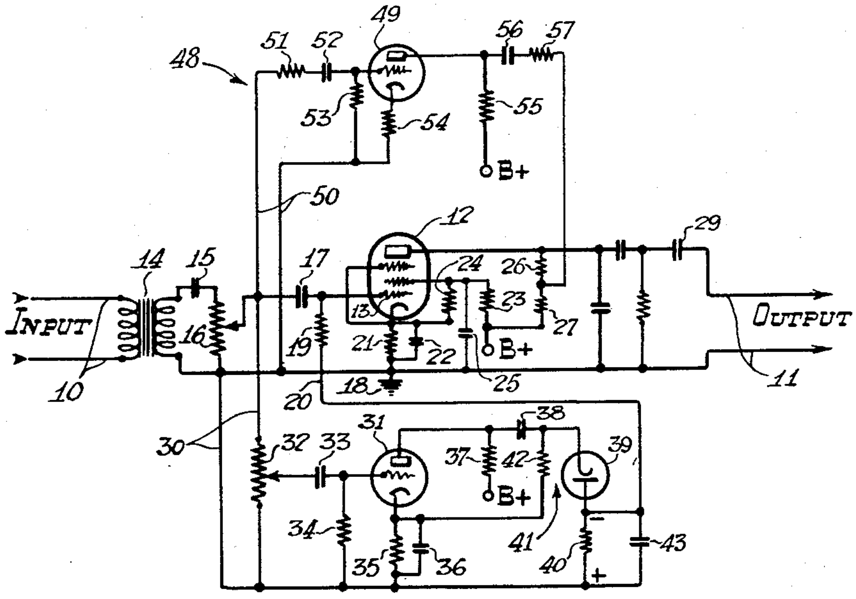

This invention relates particularly to automatic volume control systems of the fast-acting compression type. A general object of the invention is to extend the range of such systems while maintaining the output signal fairly free from distortion.

The invention has especially useful application in connection with dictation-recording equipment for recording telephone conversations, conference proceedings, etc. which vary typically through a wide volume range. It is desirable in such recording operations to maintain a fairly constant volume of recordation on the record under conditions of wide variations in input volume. This requires the use of a high gain amplifier to bring the output volume to the desired recording level when the input signals are weak and a very strong compression of the volume whenever input signals are strong. In order that the compressive action may not be accompanied by initial high volume bursts upon each onslaught of a high input signal, the automatic compressive action must be very fast.

The compressive action is obtained from a variable gain amplifier having one or more variable mu tubes with respective control grids onto which a variable D.C. bias voltage is impressed to control the gain. In order that the compressive action of such variable mu tubes may be made very fast without giving rise to problems of instability, the bias voltage is derived from the signal at the input side of the amplifier instead of at the output side where the signal level is already under influence of the compressive action of the tube. However, only input signals in excess of some predetermined threshold are utilized for developing the bias voltage in order that the compressive action will not occur until the desired output volume is obtained. When the bias voltage is developed in linear relation to the value of the input signal above a predetermined threshold, not only does the compressive action begin sharply but the bias voltage so developed increases without limit, as the input signal increases above the threshold, to cause the gain of the variable mu tube to be reduced progressively to substantially zero. This causes the output volume of the tube to pass through a maximum value and then decrease to a negligible value as the input signal increases progressively above the aforestated threshold. Still further, in the range where the output volume is falling off, the output signal is accompanied by an increasing percentage of distortion.

By my invention the aforementioned undesirable results are effectively overcome by providing a linear side circuit in parallel with the variable gain amplifier. This side circuit is adapted to supplement the output volume of the variable mu tube so as to provide a substantially constant output volume through a considerable input volume range above that where the output level of the variable mu tube is a maximum. Furthermore, since the side circuit contributes a greater percentage of the output volume as the distortion of the output of the variable mu tube increases, the resultant distortion in the combined output signal is kept at a low level.

An object of my invention is therefore to provide an improved automatic volume control system of the fast-acting type which has a substantially constant output volume over a wide range of input volume and which has a low order of distortion in the output signal throughout the compressive range.

Figure 2:
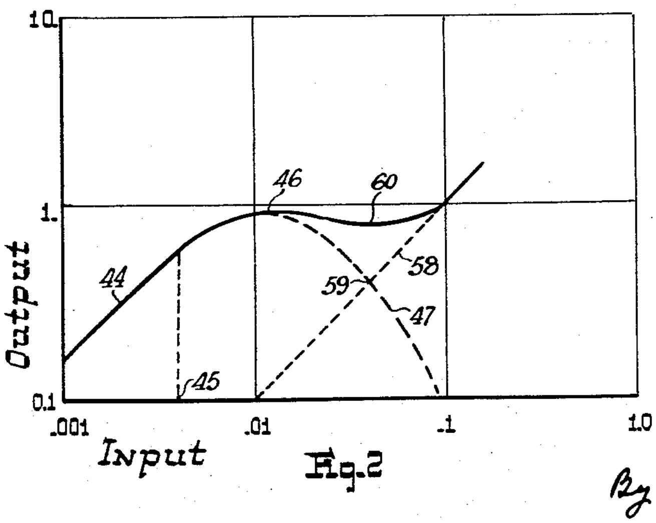

In the description of my invention reference is had to the accompanying drawings, of which:

Figure 1 is a schematic circuit diagram of an automatic volume compression system according to my invention; and Figure 2 is a graph showing approximate output-input curves of the several components as well as of the composite system of my invention.

The automatic volume compression system shown in Figure 1 has an input circuit 10 and an output circuit 11 between which is connected a variable mu pentode tube 12, for example a 6BJ6 tube, having a cathode, control grid, screen grid, suppressor grid and plate elements in the order named. The input circuit is coupled to the control grid, designated 13, as through a transformer 14, condenser 15, potentiometer 16 and blocking condenser 17. This coupling circuit is grounded as at 18. Connected also to the control grid is a grid leak resistor 19 provided in a bias control circuit 20 hereinafter described. The cathode is connected through a paralleled resistor 21 and a by-pass condenser 22 to the ground side 18. The screen grid is supplied with voltage from a voltage divider circuit comprising resistors 23 and 24 connected serially between a source of voltage marked B+ and the cathode. This circuit forms therefore a bleeder circuit adapted to supply a fixed component of bias voltage for the control grid 13. A condenser 25 by-passes the screen grid to ground. The suppressor grid is connected in the usual way to the cathode. The plate is connected through series resistors 26 and 27 to the B+ voltage source. Additionally, the plate is connected through a filter 28 and blocking condenser 29 to the output circuit 11.

Connected to the input side just past the volume control 16 is a circuit 30 which leads to a bias amplifier tube 31 which may typically be a triode section of a 12AT7 tube. The circuit 30 is connected to the control grid of this tube through a potentiometer 32 and blocking condenser 33. The control grid is also connected through a grid leak resistor 34 to ground. The cathode of this tube is connected through a resistor 35 and by-pass condenser 36 to ground. The plate of this tube is connected to the B+ voltage source through a plate load resistor 37. Also, the plate is connected through a condenser 38, rectifier 39 (which may be the other half section of the aforementioned tube 12AT7), and resistor 40 to ground, the rectifier being so poled as to be conductive in the direction of the arrow 41 from ground to the plate of the tube 31. A biased condition for the rectifier is obtained by connecting the cathode side thereof through resistor 42 to the cathode of the tube 31. Paralleling the load resistor 40 is a condenser 43, and connected to the plate side of the rectifier 39 is the aforementioned bias control circuit 20 for the variable mu tube 12.

The operation of this system as so far described is as follows: When there is no input signal the control grid 13 of the variable mu tube 12 is held effectively at ground potential through the circuit 20 and resistor 40. The tube 12 then operates at a minimum bias obtained across the cathode resistor 21 and has its maximum operating gain. This condition remains until the input signal to the system reaches a threshold level causing the negative peak voltages from the plate of the bias amplifier tube 31 to exceed the D.C. positive bias on the cathode of the rectifier 39 established by the value of the bias resistor 35 in the cathode circuit of the tube 31. The input signal level at which this threshold occurs may be varied by varying the setting of the potentiometer 32. In the lower range of input signal below this threshold the tube 12 acts as a linear amplifier having a fixed gain. As the input signal increases above this threshold, the rectifier 39 becomes conductive to cause current to flow through the load resistor 40 in the direction of the arrow 41. This current produces a voltage drop across the load resistor 40 substantially in linear relation to the value of the input voltage above the aforestated threshold. This voltage drop across the resistor 40 provides an increasing bias voltage on the control grid 13 the effect of which is to decrease the gain of the tube 12 from its maximum value. The condenser 43 may be relatively small so that the charging time constant (product of the condenser value and effective output resistance of the tube 31) is short to enable very fast compressive action. However, the RC product of the resistor 40 and condenser 43 is made relatively high so that the discharge time is long.

With reference to Figure 2 which shows output-input characteristics of the present system plotted to log scale, the output volume will vary linearly with the input volume along the line 44 (at a 45° angle to the coordinate axes) until the input reaches the threshold level above referred to and here designated 45. As the input level rises above this threshold, the bias voltage on the control grid 13 is increased proportionately to cause a sharp tapering off of the output volume in the region designated 46. Since the bias voltage is linearly proportional to the input signal, the gain of the variable mu tube 12 is reduced progressively as the input signal increases above the threshold. This causes the output volume to pass through a peak at 46 and to decrease thereupon along the curve 47 to a negligible value. As the output volume falls off along the curve 47, the output signal is accompanied by an increasing percentage of distortion.

In accordance with my invention I provide a unidirectional side circuit 48 in parallel with the variable mu tube 12 which is adapted to compensate for the decreasing output volume and increasing output distortion of the variable mu tube in the higher input volume range. This side circuit may comprise a single triode amplifier tube such, for example, as a 6C4 tube designated 49. The control grid of this tube is connected to the input circuit from a point just past the input potentiometer 16 by a circuit 50 through a resistor 51 and blocking condenser 52. Also, the control grid is connected to ground through a grid leak resistor 53. The cathode is connected to ground through a bias resistor 54 and the plate is connected to B+ through the plate load resistor 55. This plate is also connected by a blocking condenser 56 and resistor 57 to the junction point between the plate load resistors 26 and 27 of the variable mu tube 12. By this connection the output signal from the side amplifier tube 49 is combined with the output signal from the variable mu tube in substantially the same phase relation thereto, since each tube contributes a 180° phase shift, to cause the signals to be additive in the output circuit. However, the resistors 51 and 53 at the input end of the side circuit and the resistors 57, 26 and 27 at the output end thereof constitute attenuators which reduce appreciably the effective gain of the side circuit. Additionally, the output attenuator is adapted to prevent the relatively low plate impedance of the triode 49 from shunting substantially the high plate impedance of the pentode 12.

The output-input characteristic 58 of the side circuit is a straight line at 45° to the coordinate axes. This line 58 crosses the drooping portion 47 of the output-input curve of the variable mu tube at the point 59. Typically, this crossover point may be one where the gain of the variable mu tube has fallen about 25 decibels from its maximum value. For example, if the maximum gain of the variable mu tube 12 is 45 decibels, the crossover point 59 may be that where its gain has been reduced to about 20 decibels. The composite output-input characteristic 60—which is the arithmetic sum of the output signals of the side and main circuits—in then maintained at a fairly constant level through a continuing 20 decibel increase in input level above that at which the variable mu tube has its maximum output volume; however, with further increase in the input level, the output volume will follow the straight-line characteristic 58 of the side circuit since the variable mu tube is then no longer contributing to the output. Because of the decreasing contribution of the variable mu tube and the increasing contribution of the side circuit through the compressed range, the distortion of the composite output signal is kept fairly low. Thus, by adding a single linear side circuit around the variable gain amplifier stage in accordance with my invention, the output level is held fairly constant throughout a wide range of variation of the input volume and distortion is yet kept at a low level.

It will be apparent that the present system can be adjusted in various ways, as follows:

(1) The main volume control 16 can be adjusted to shift all of the curves of Figure 2 along the input axis;

(2) The volume control 32 can be adjusted to shift the level of the peak output 46 as well as to shift concurrently the threshold 45, at which the automatic volume control begins, along the input axis;

(3) The volume control 32 and the bias resistor 35 can be varied correspondingly to increase and decrease the sharpness of the automatic volume control without displacing the threshold 45, the action being sharper, for example, when the volume control is set to a higher level and the bias resistor is set to a correspondingly higher value; and (4) The effective gain of the side circuit 48 can be varied by means of the attenuators at the input and output ends of the tube 49 and by control of the gain of this tube to determine the positioning of the curve 58 along the input axis.

The particular embodiment of my invention herein shown and described is intended to be illustrative and not limitative of my invention since the same is subject to changes and modifications without departure from the scope of my invention, which I endeavor to express according to the following claim.

I claim:

An automatic volume control system comprising a main amplifier provided with a gain control element for decreasing and increasing the gain of the main amplifier respectively as the bias voltage on said control element is increased and decreased, means providing said control element with a fixed component of bias voltage of minimum value for normally holding the gain of said main amplifier at a maximum, a bias amplifier connected to the input of said main amplifier, means for rectifying the output of said bias amplifier and feeding the rectified voltage to said control element to cause the bias voltage on said control element to be steadily increased and the output signal of the main amplifier to rise to a maximum value and then fall from said maximum value as the level of the input signal fed to the main amplifier is steadily increased, and a side amplifier connected in parallel with said main amplifier, said amplifier having a phase characteristic equal substantially to that of said main amplifier and having a fixed gain which is substantially less than that of said main amplifier when the output signal from the main amplifier is at said maximum value whereby the output signals of said main and side amplifiers are additive and their combined level maintained substantially constant at said maximum value over an extended range of input signal level.

References Cited in the file of this patent

UNITED STATES PATENTS

| | | |
|---|---|---|
| 2,006,052 | Kreuzer | June 25, 1935 |
| 2,129,727 | Barber | Sept. 13, 1938 |
| 2,201,022 | Bartels et al. | May 14, 1940 |

(Other references on following page)

UNITED STATES PATENTS

| | | |
|---|---|---|
| 2,221,681 | Schlegel | Nov. 12, 1940 |
| 2,251,594 | Mayne | Aug. 5, 1941 |
| 2,258,762 | Hickok | Oct. 14, 1941 |
| 2,296,626 | Blumlein | Sept. 22, 1942 |
| 2,378,999 | Gillespie | June 26, 1945 |
| 2,480,201 | Selove | Aug. 30, 1949 |
| 2,646,469 | Long | July 21, 1953 |
| 2,695,338 | Doriot | Nov. 23, 1954 |
| 2,719,272 | Gannett | Sept. 27, 1955 |
| 2,756,287 | Gregory | July 24, 1956 |
| 2,771,518 | Sziklai | Nov. 20, 1956 |
| 2,781,423 | Kuczun | Feb. 27, 1957 |

FOREIGN PATENTS

| | | |
|---|---|---|
| 902,415 | France | Dec. 4, 1944 |
| 645,256 | Great Britain | Oct. 25, 1950 |